United States Patent
Baars et al.

(10) Patent No.: US 8,987,104 B2
(45) Date of Patent: Mar. 24, 2015

(54) METHOD OF FORMING SPACERS THAT PROVIDE ENHANCED PROTECTION FOR GATE ELECTRODE STRUCTURES

(75) Inventors: Peter Baars, Dresden (DE); Sven Beyer, Dresden (DE); Jan Hoentschel, Dresden (DE); Thilo Scheiper, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/108,363

(22) Filed: May 16, 2011

(65) Prior Publication Data

US 2012/0292671 A1 Nov. 22, 2012

(51) Int. Cl.
| | | |
|---|---|---|
| H01L 21/336 | (2006.01) | |
| H01L 21/3205 | (2006.01) | |
| H01L 21/4763 | (2006.01) | |
| H01L 29/66 | (2006.01) | |
| H01L 29/78 | (2006.01) | |
| H01L 29/786 | (2006.01) | |

(52) U.S. Cl.
CPC ...... *H01L 29/66772* (2013.01); *H01L 29/6656* (2013.01); *H01L 29/6659* (2013.01); *H01L 29/7833* (2013.01); *H01L 29/7843* (2013.01); *H01L 29/78618* (2013.01); *H01L 29/78687* (2013.01)

USPC .......................................... 438/303; 438/595

(58) Field of Classification Search
None
See application file for complete search history.

(56) References Cited

U.S. PATENT DOCUMENTS

| | | | |
|---|---|---|---|
| 7,112,497 B2 * | 9/2006 | Mehrad et al. ................ 438/303 |
| 7,354,838 B2 * | 4/2008 | Kammler et al. ............. 438/303 |
| 7,569,464 B2 * | 8/2009 | Kirmse et al. ................ 438/514 |
| 7,877,161 B2 | 1/2011 | Tomoyasu et al. |
| 2007/0001233 A1 * | 1/2007 | Schwan et al. ............... 257/369 |
| 2008/0203486 A1 * | 8/2008 | Wiatr et al. .................. 257/369 |
| 2008/0293193 A1 * | 11/2008 | Visokay et al. .............. 438/199 |
| 2009/0001479 A1 * | 1/2009 | Wiatr et al. .................. 257/384 |
| 2009/0273034 A1 * | 11/2009 | Woon et al. .................. 257/368 |
| 2009/0294877 A1 * | 12/2009 | Tsutsui ........................ 257/411 |

* cited by examiner

*Primary Examiner* — Michael Jung
(74) *Attorney, Agent, or Firm* — Amerson Law Firm, PLLC

(57) ABSTRACT

Disclosed herein is a method of forming a semiconductor device. In one example, the method comprises forming a gate electrode structure above a semiconducting substrate and forming a plurality of spacers proximate the gate electrode structures, wherein the plurality of spacers comprises a first silicon nitride spacer positioned adjacent a sidewall of the gate electrode structure, a generally L-shaped silicon nitride spacer positioned adjacent the first silicon nitride spacer, and a silicon dioxide spacer positioned adjacent the generally L-shaped silicon nitride spacer.

18 Claims, 4 Drawing Sheets

METHOD OF FORMING SPACERS THAT PROVIDE ENHANCED PROTECTION FOR GATE ELECTRODE STRUCTURES

BACKGROUND OF THE INVENTION

1. Field of the Invention

Generally, the present disclosure generally relates to the manufacturing of sophisticated semiconductor devices, and, more specifically, to a method of forming sidewall spacers for gate electrode structures.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors (NMOS) and/or P-channel transistors (PMOS), are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends upon a variety of factors, such as the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on, among other things, the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Historically, in field effect transistors, silicon dioxide has typically been used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 μm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include so-called high-k materials (k value greater than 10) that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the typical polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed. For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. As noted above, given that the gate length on modern transistor devices is 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a device would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from the PMOS transistors. The techniques employed in forming such nitride layers for selective channel stress engineering purposes are well known to those skilled in the art.

Typically, one or more sidewall spacers are formed adjacent the gate electrode structures of transistors for a variety of reasons, such as to protect the gate electrode materials, to insure that subsequent structures, such a metal silicide regions formed on the source and drain regions of a transistor, are formed a minimum distance away from the channel region of the device, etc. FIGS. 1A-1C depict a simplified view of an illustrative semiconductor device 100 at an early stage of manufacturing that is formed above a semiconducting substrate 10. In one illustrative embodiment, the semiconducting substrate 10 is comprised of silicon. The substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration. At the point of fabrication depicted in FIG. 1A, the semiconductor device 100, e.g., a transistor, includes a gate electrode structure 20 that includes a gate insulation layer 20A that may be made of, for example, silicon dioxide, a high-k gate insulation layer 20B, a metal layer 20C that may be made of, for example, titanium nitride, and a conductive layer 20D that may be made of, for example, polysilicon, amorphous silicon, etc. The gate electrode structure 20 may be made using techniques well known to those skilled in the art.

Also depicted in FIG. 1A are simplified depictions of sidewall spacers 22, 24, and 26 that are formed adjacent the gate electrode structure 20. In some cases, people within the industry may refer to the spacer 22 as "spacer 0", whereas the combination of the spacers 24 and 26 may be referred to as "spacer 1." Of course, additional spacers other than those depicted in FIG. 1A can be formed on the device 100 if needed or desired for the particular application. In general, each of the spacers 22, 24 and 26 is formed by depositing a layer of spacer material and thereafter performing an etching process to remove the undesired parts of such a deposited layer of spacer material. In one embodiment, the spacer 22 is made of silicon nitride and it has a thickness of 3-6 nm, the spacer 24 is made of silicon dioxide and it has a thickness of 2-4 nm, and the spacer 26 is made of silicon nitride and it has a thickness of 10-30 nm. These various spacers serve different purposes. For example, spacer 22, is provided to, among other things, physically protect one or more of the layers in the gate electrode structure 20 from attack during subsequent processing operations. In some cases, the spacer 22 may also be formed prior to performing a relatively heavy source-drain implant so as to properly position the implant region on a device, such as an NMOS transistor. In other cases the spacer 22 may be employed to properly locate a another structure of layer of material, such as silicon germanium, that may be grown in the source/drain regions of a PMOS transistor. The silicon dioxide L-shaped spacer 24 is typically provide to, in theory, protect the silicon nitride spacer 22 from subsequent etching processes that may attack the silicon nitride spacer 22, with the ultimate objective always being to insure the integrity of the silicon nitride spacer 22 so as to protect the gate electrode structure 20. The silicon nitride spacer 26, in combination with the L-shaped silicon dioxide spacer 26, may be employed to properly located metal silicide regions (not shown) on the source/drain regions that will be formed for the device 100.

One problem associated with the prior art spacer configuration disclosed above is that the silicon nitride spacer 22 can be undesirably attacked in subsequent etching process which can cause at least portions of the gate electrode structure 20 to likewise be subject to undesirable attacks or degradation. For example, if the integrity of the silicon nitride spacer 22 is compromised enough, the metal layer 20C, e.g., titanium nitride, may be subject to attack by subsequent etching operations performed to remove nitride based layers, like subsequent etching processes performed to remove all or part of the stressed nitride layers that are formed for channel stress engineering purposes. Additionally, if the metal layer 20C is exposed, oxygen may ingress into the metal layer 20C which may cause the resulting device 100 to exhibit a higher threshold voltage than would otherwise be desired, which can reduce device performance.

FIG. 1B depicts the device 100 after some subsequent processing operations have been performed and depicts an example where the overall height of the silicon nitride spacer 22 has been reduced during such process operations, thereby exposing a portion of the gate electrode structure 20. Typically, after the silicon nitride spacer 26 is formed, and the metal silicide regions (not shown) for the device 100 are formed on the source/drain regions (not shown), the silicon nitride spacer 26 is removed by performing an etching process. However, during this process, the upper surface 22S (see FIG. 1A) of the silicon nitride spacer 22 is also exposed to this etching process and therefore subject to attack. During the etching process performed to remove the silicon nitride spacer 26, the L-shaped silicon dioxide spacer 24 is intended to protect the silicon nitride spacer 22 from that etching process. However, for a variety of reasons, the L-shaped silicon dioxide spacer 24 is not always effective at performing this task. For example, the L-shaped silicon dioxide spacer 24 is relatively thin to begin with and uneven device topography, which is typically present, makes it difficult to form the L-shaped silicon dioxide spacer 24 such that it uniformly has the desired minimum thickness for protecting the silicon nitride spacer 22. Processing variations from tool to tool may also make forming the L-shaped silicon dioxide spacer 24 uniform and repeatable manner difficult.

FIG. 1C depicts the device 100 after it has be subject to further attack such as when the silicon nitride layers used for channel stress engineering purposes are selectively formed and removed from above the NMOS and PMOS devices on the substrate. In FIG. 1C, the degradation of the silicon nitride spacer 22 is such that the metal layer 20C, e.g., titanium nitride, is exposed to subsequent processing techniques and perhaps to oxygen ingress into the metal layer 20C, as mentioned above.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed the manufacturing of sophisticated semiconductor devices, and, more specifically, to a method of forming sidewall spacers for gate electrode structures. In one example, the method comprises forming a gate electrode structure above a semiconducting substrate and forming a plurality of spacers proximate the gate electrode structures, wherein the plurality of spacers comprises a first silicon nitride spacer positioned adjacent a sidewall of the gate electrode structure, a generally L-shaped silicon nitride spacer positioned adjacent the first silicon nitride spacer, and a silicon dioxide spacer positioned adjacent the generally L-shaped silicon nitride spacer.

A further illustrative method disclosed herein includes forming a gate electrode structure above a semiconducting substrate and forming a first silicon nitride spacer adjacent a sidewall of the gate electrode structure by depositing a first layer of silicon nitride above the gate electrode structure and the substrate and performing a first etching process on the first layer of silicon nitride. The method further includes forming a second layer of silicon nitride above the gate electrode structure and the first silicon nitride spacer, forming a layer of silicon dioxide above the second layer of silicon nitride and performing a second etching process to remove portions of the layer of silicon dioxide to thereby define a silicon dioxide spacer. The method concludes with, after forming the silicon dioxide spacer, performing a third etching process to remove portions of the second layer of silicon nitride while using the silicon dioxide spacer as a mask to thereby define a generally L-shaped silicon nitride spacer positioned between the first silicon nitride spacer and the silicon dioxide spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
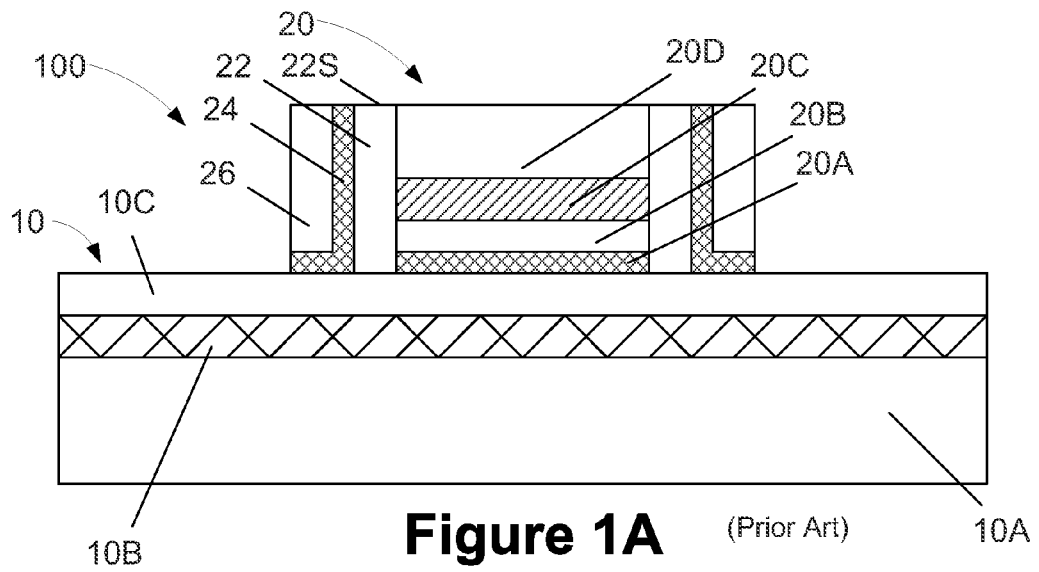
FIGS. 1A-1C schematically depicts an illustrative prior art semiconductor device with an illustrative configuration of sidewall spacers.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
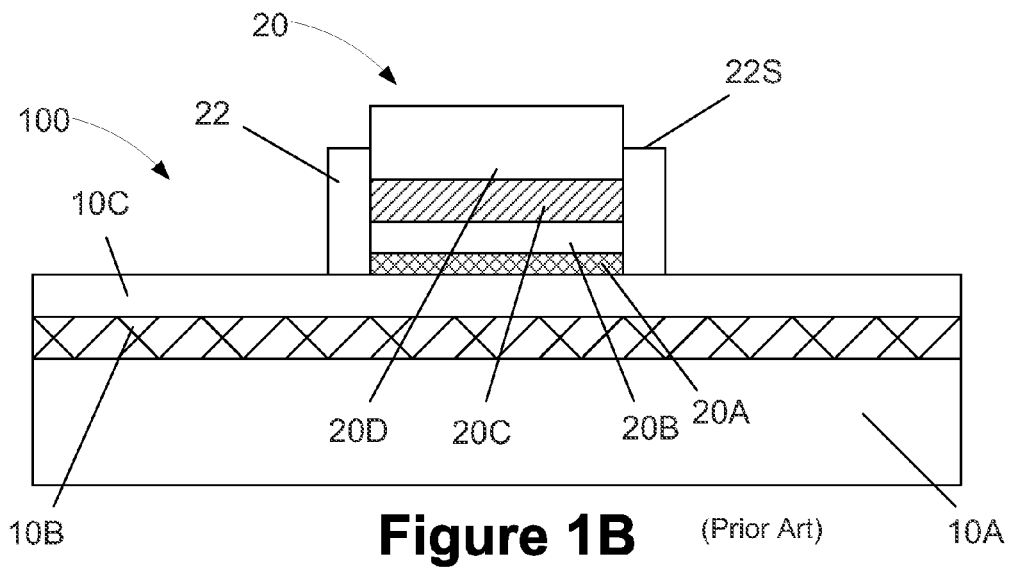
Figure 1C:
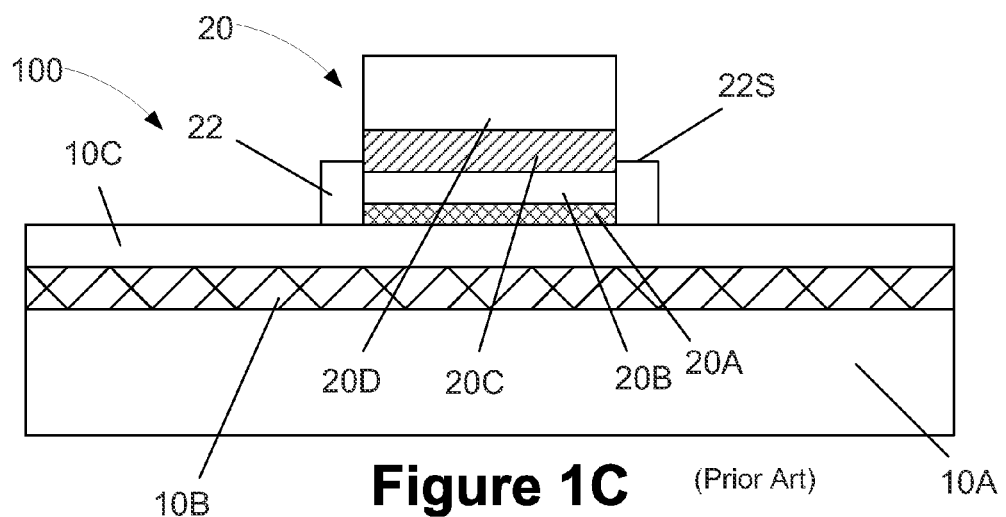

The present disclosure is directed to techniques that may be employed in forming sidewall spacers for gate electrode structures for various integrated circuit devices while reducing or perhaps eliminating at least some of the problems discussed in the background section of this application. In some cases, the transistors may include a high-k dielectric material (k value greater than 10) and a metal-containing electrode material. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc. With reference to FIGS. 2 and 3A-3F, further illustrative embodiments will now be described in more detail, wherein reference may also be made to FIGS. 1A-1C, if required, wherein the use of the same reference number in the drawings will refer to the same structure as previously described.

Figure 2:
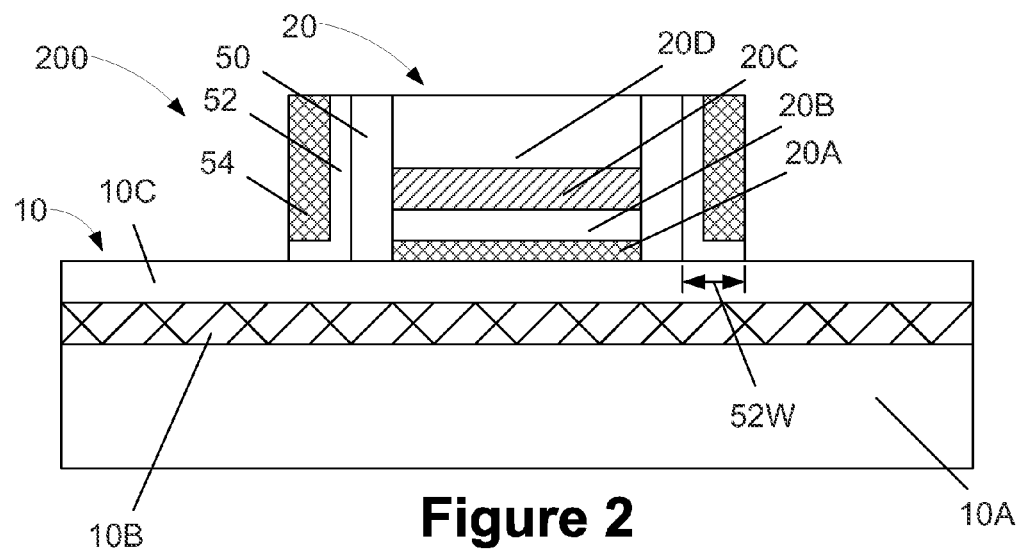
FIG. 2 depicts one illustrative example of a partially formed semiconductor device comprising the novel sidewall spacer configuration disclosed herein.

FIG. 2 is a simplified view of an illustrative semiconductor device 200 at an early stage of manufacturing that is formed above a semiconducting substrate 10. As noted previously, the substrate 10 may have a variety of configurations, such the depicted silicon-on-insulator (SOI) structure having a bulk silicon layer 10A, a buried insulation layer 10B and an active layer 10C. The substrate 10 may also have a simple bulk silicon configuration. Thus, the terms substrate or semiconductor substrate should be understood to cover all semiconductor structures. At the point of fabrication depicted in FIG. 2, the semiconductor device 100, e.g., a transistor, includes a gate electrode structure 20 that includes a gate insulation layer 20A that may be made of, for example, silicon dioxide, a high-k gate insulation layer 20B, a metal layer 20C that may be made of, for example, titanium nitride, and a conductive layer 20D that may be made of, for example, polysilicon, amorphous silicon, etc. The gate electrode structure 20 may be made using techniques well known to those skilled in the art, such as gate-last or gate-first techniques, although the drawings depict an illustrative gate-first technique.

Also depicted in FIG. 2 are simplified depictions of a silicon nitride sidewall spacer 50, a generally L-shaped silicon nitride spacer 52, and a silicon dioxide spacer 54, or a material that is selectively removable relative to the L-shaped silicon nitride spacer 52 without causing too much damage to the STI structure that are formed adjacent the gate electrode structure 20. In the illustrative example depicted herein, the silicon nitride sidewall spacer 50 is actually formed so as to contact the sidewalls of the gate electrode structure 20. However, in some applications, one or more liners or layers of material may be positioned between the sidewalls of the gate electrode structure 20. Thus, when it is stated herein or in the claims that the silicon nitride sidewall spacer 50 is formed "adjacent" the gate electrode structure 20, it will be understood to cover situations where the silicon nitride sidewall spacer 50 actually contacts the gate electrode structure 20 as well as situation where there are one or more intervening layers of material between the silicon nitride sidewall spacer 50 and the gate electrode structure 20. Of course, additional spacers other than those depicted in FIG. 2 can be formed on the device 200 if needed or desired for the particular application. In one embodiment, silicon nitride sidewall spacer 50 has a thickness of 3-6 nm, L-shaped silicon nitride spacer 52 has a thickness of 2-4 nm, and the silicon dioxide spacer 54 has a thickness of 1-30 nm. In one illustrative embodiment, the width 52W of the generally L-shaped silicon nitride spacer 52 at its base may range from 15-40 nm. In general, each of the spacers 50, 52 and 54 may be formed by formed by depositing a layer of spacer material and thereafter performing an etching process to remove the undesired parts of such a deposited layer of spacer material, as described more fully below.

One illustrative process flow for forming the novel sidewall spacer configuration disclosed above in connection with FIG. 2 above will now be described with reference to FIGS. 3A-3F. In this illustrative process flow, the manufacture of an illustrative PMOS transistor 210, however, as noted earlier, the methods disclosed herein are equally applicable to other devices such as NMOS transistors. So as not to obscure the present invention, isolation structures, such as trench isolation structures, that are typically formed in the active layer 10C so as to electrically isolate the semiconductor device 200 from other semiconductor devices is not depicted in the drawings. At the stage of manufacture depicted in FIG. 3A, the gate electrode structure 20 has been formed using any of a variety of known techniques. Thereafter, the silicon nitride sidewall spacer 50 is formed by blanket-depositing a layer of silicon nitride material above the substrate 10 and adjacent the gate electrode structure 20 and thereafter performing an anisotropic etching process 2 to remove the horizontal portions of the layer of silicon nitride which results in the simplistically depicted silicon nitride sidewall spacers 50. The layer of silicon nitride that is used to manufacture the silicon nitride sidewall spacer 50 may be formed by any technique, such as physical vapor deposition (PVD), chemical vapor deposition (CVD), and plasma enhanced versions of those processes, etc.

Figure 3A:
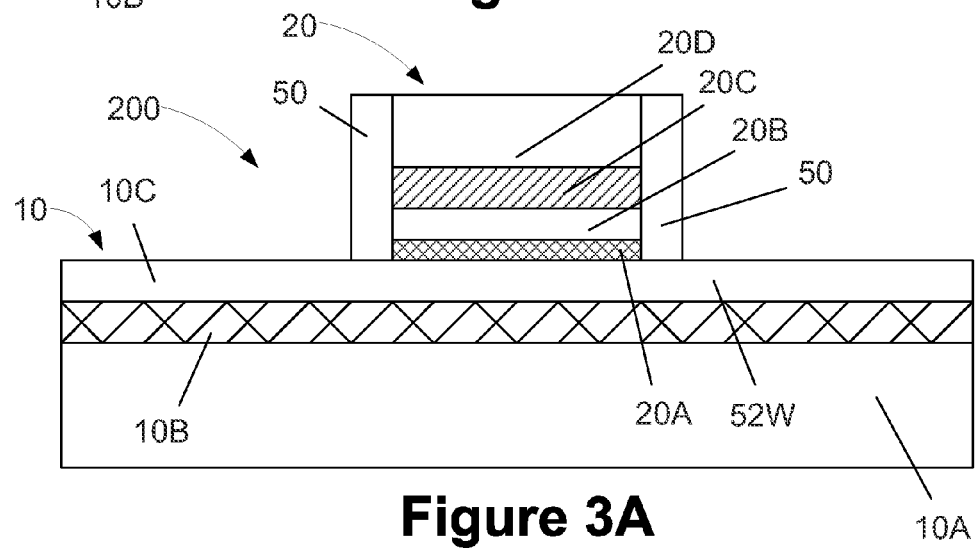
FIGS. 3A-3F depict one illustrative process flow disclosed herein for manufacturing the semiconductor device depicted in FIG. 2.
Figure 3B:
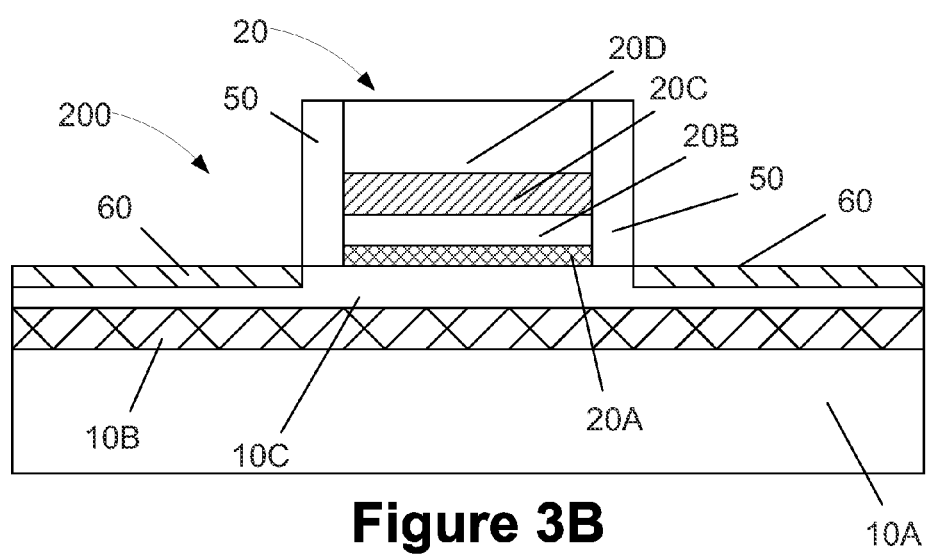

Next, as shown in FIG. 3B, for the illustrative PMOS transistor depicted herein, the process flow may, in one example, involve the formation of silicon-germanium regions 60 in and/or above the active layer 10C of the substrate 10 in the area where source/drain regions (not shown) will be formed for the device 200. This process typically involves the formation of recesses in the active layer 10C followed by the epitaxial deposition of the Si—Ge regions 60, all of which is performed in accordance with known processing techniques. In this illustrative example the silicon nitride sidewall spacer 50 act to, among other things, aid in the formation of the recesses in the active layer 10C prior to the formation of the Si—Ge regions 60.

Figure 3C:
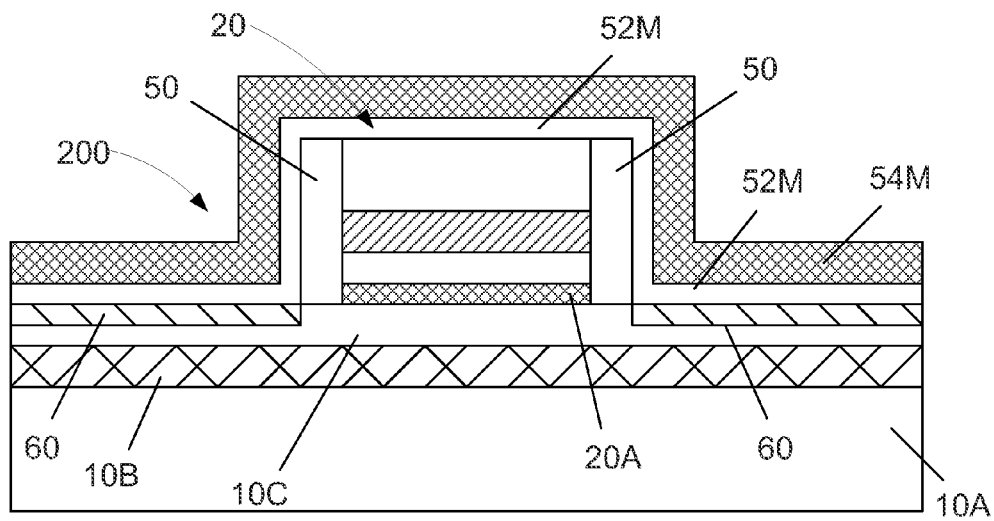

Next, as shown in FIG. 3C, a layer of silicon nitride 52M and a layer of silicon dioxide 54M are deposited above the substrate using any of a variety of known deposition techniques, e.g., PVD, CVE, etc. The thickness of the layers 52M, 54M will generally correspond to the desired thickness of the L-shaped silicon nitride spacer 52 and the silicon dioxide spacer 54, respectively.

Figure 3D:
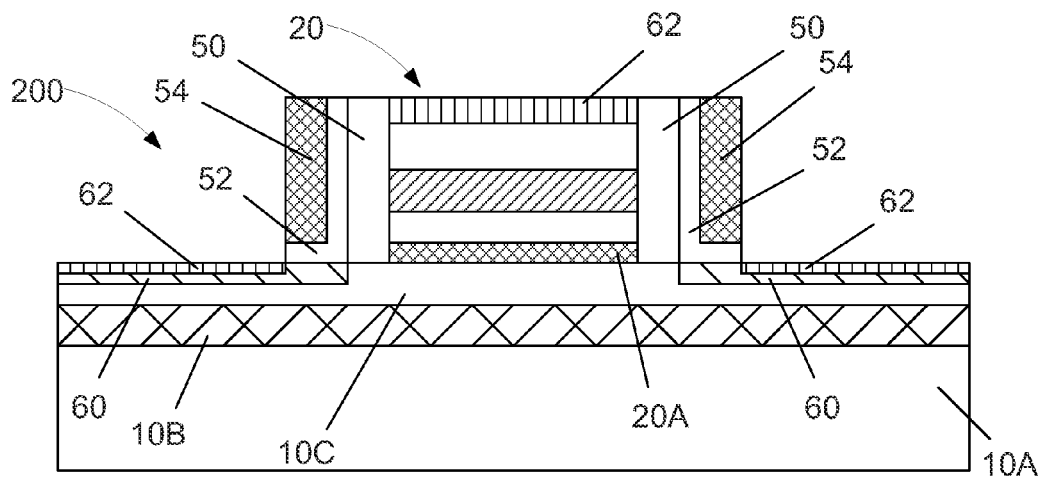

Next, as shown in FIG. 3D, one or more etching processes is performed to essentially remove the horizontal portions of the layers 52M and 54M to thereby result in the formation of the L-shaped silicon nitride spacer 52 and the silicon dioxide spacer 54. In one illustrative example, the etching processes may be dry anisotropic etching processes. Note that during the etching process to remove excess portions of the material layer 52M, the silicon dioxide spacer 54 acts as a mask to result in the formation of the L-shaped silicon nitride spacer 52 discussed above.

Additional processing operations are then performed to complete formation of the device 200. For example, source/drain implantation processes are performed (source/drain regions not depicted in the drawing for sake of clarity) followed by the formation of metal silicide regions 62 on the gate electrode surface and the source/drain regions. During the silicide formation process, in one illustrative embodiment, the width 52W of the L-shaped silicon nitride spacer 52 acts to limit how close the metal silicide regions 62 can be positioned to the channel region of the device 200.

Figure 3E:
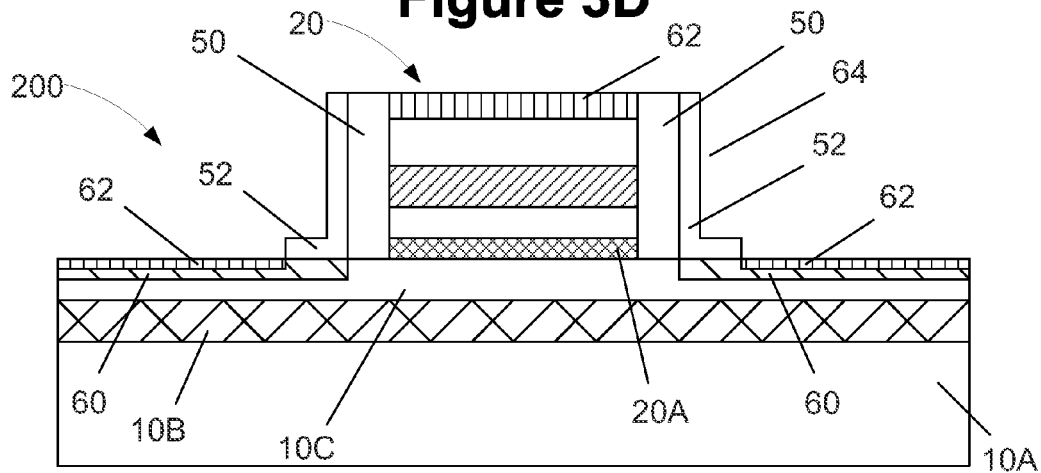

As shown in FIG. 3E, the next step involves performing an etching process to remove the silicon dioxide spacer 54. Ideally, the etching process used to remove the silicon dioxide spacer 54 will be highly selective to the silicon nitride used to form the spacers 50, 52. In one illustrative embodiment the etching process used to remove the silicon dioxide spacer 54 is a chemical dry etching process. In a more specific example, the etching process may be a dry HF isotropic etching process as disclosed in U.S. Pat. No. 7,877,161 assigned to Tokyo Electron Limited, which is hereby incorporated by reference in its entirety.

Figure 3F:
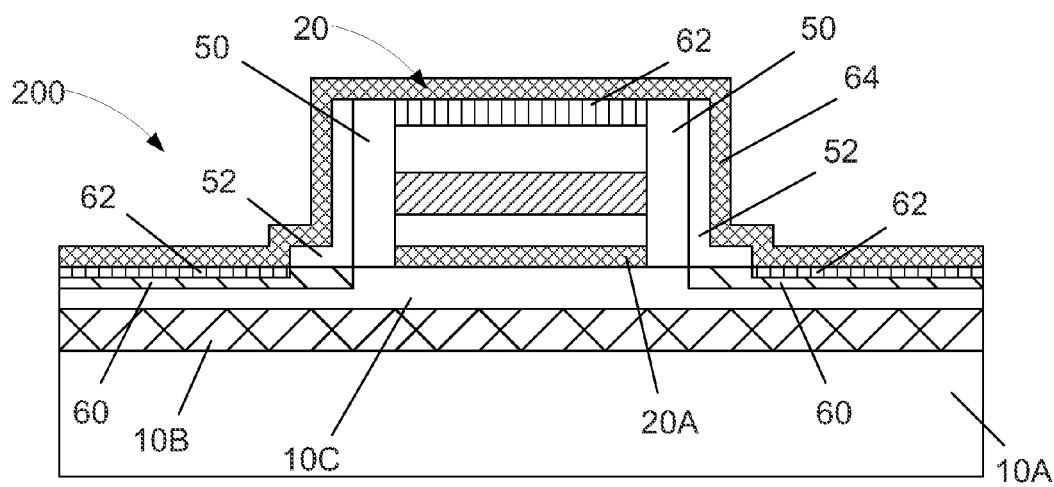

Then, as shown in FIG. 3F, in one illustrative example, a layer of silicon dioxide 64 may be deposited above the substrate 10. The layer of silicon dioxide 64 may have a thickness ranging from 4-8 nm, and it may be formed by a CVD process, for example. The layer of silicon dioxide 64 is typically used as a etch stop layer for the subsequent layer of silicon nitride (not shown) that is formed to selectively induce a desired stress in the channel region of the semiconductor device 200, e.g., a compressive stress in the channel region for an illustrative PMOS transistor. Of course, in other illustrative examples, depending on the desired integration scheme, the oxide layer 64 may be omitted and the silicon nitride layer may be deposited on the device. Given the novel process flow described herein, the chances of oxygen ingress into the gate electrode structure 20 may be significantly reduced to the presence of the generally L-shaped silicon nitride spacer 52 even after the silicon dioxide spacer 54 was removed by an etching process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode structure above a semiconducting substrate;
    forming a first non-L-shaped spacer adjacent to a sidewall of said gate electrode structure, said first non-L-shaped spacer comprising silicon nitride and having a vertical leg aligned with said sidewall but not having a horizontal leg extending laterally away from said sidewall;
    after forming said first non-L-shaped spacer, forming an L-shaped spacer comprising silicon nitride and having a vertical leg portion that is formed on and in direct physical contact with said vertical leg of said first non-L-shaped spacer and having a horizontal leg portion that is formed on and in direct physical contact with said semiconducting substrate and extends laterally away from said sidewall;
    forming a second non-L-shaped spacer comprising silicon dioxide and having a vertical leg aligned with said sidewall but not having a horizontal leg extending laterally away from said sidewall, wherein said vertical leg of said second non-L-shaped spacer is formed on and in direct physical contact with said vertical and horizontal leg portions of said L-shaped spacer and a total lateral width of said L-shaped spacer is defined by a combined thickness of said vertical leg portion of said L-shaped spacer and a thickness at a base of said vertical leg of said second non-L-shaped spacer; and
    performing a dry isotropic etching process to remove said second non-L-shaped spacer while leaving said L-shaped spacer and said first non-L-shaped spacer in position.

2. The method of claim 1, wherein said horizontal leg portion of said L-shaped spacer separates said second non-L-shaped spacer from said semiconducting substrate.

3. The method of claim 1, wherein forming said first non-L-shaped spacer comprises depositing a layer of silicon nitride above said gate electrode structure and said semiconducting substrate and performing an anisotropic etching process.

4. The method of claim 1, wherein forming said L-shaped spacer and said second non-L-shaped spacer comprises:
    forming a layer of silicon nitride above said gate electrode structure and said semiconducting substrate and on and in direct physical contact with said vertical leg of said first non-L-shaped spacer;
    forming a layer of silicon dioxide on and in direct physical contact with said layer of silicon nitride;
    performing a first etching process to remove horizontal portions of said layer of silicon dioxide from above said layer of silicon nitride so as to define said vertical leg of said second non-L-shaped spacer having an exposed outer surface; and
    after forming said second non-L-shaped spacer, performing a second etching process to remove portions of said layer of silicon nitride while using second non-L-shaped spacer as a mask so as to define said L-shaped spacer, wherein after performing said second etching process, an outside edge of said horizontal leg portion of said L-shaped spacer is aligned with said exposed outer surface of said vertical leg of said second non-L-shaped spacer.

5. The method of claim 1, wherein said first non-L-shaped spacer is formed on and in direct physical contact with said sidewall of said gate electrode structure.

6. The method of claim 1, further comprising, after removing said second non-L-shaped spacer, forming a material layer comprising one of silicon dioxide and silicon nitride above said semiconducting substrate, said L-shaped spacer, and said gate electrode structure.

7. The method of claim 1, wherein said gate electrode structure comprises a high-k insulation layer and a metal layer positioned above said high-k insulation layer.

8. A method, comprising:
    forming a gate electrode structure above a semiconducting substrate;
    forming a first non-L-shaped spacer on and in direct physical contact with a sidewall of said gate electrode structure, said first non-L-shaped spacer comprising silicon nitride and having a vertical leg aligned with said sidewall but not having a horizontal leg extending laterally away from said sidewall;
    after forming said first non-L-shaped spacer, forming an L-shaped spacer comprising silicon nitride and having a vertical leg portion that is formed on and in direct physical contact with said vertical leg of said first non-L-shaped spacer and having a horizontal leg portion extending laterally away from said sidewall;
    forming a second non-L-shaped spacer comprising silicon dioxide and having a vertical leg aligned with said sidewall but not having a horizontal leg extending laterally away from said sidewall, wherein said vertical leg of said second non-L-shaped spacer is formed on and in direct physical contact with said vertical and horizontal leg portions of said L-shaped spacer and a lateral width of said L-shaped spacer is defined by an exposed outer surface of said vertical leg of said second non-L-shaped spacer; and
    performing a dry isotropic etching process to remove said second non-L-shaped spacer while leaving said L-shaped spacer and said first non-L-shaped spacer in position.

9. The method of claim 8, further comprising, after removing said second non-L-shaped spacer, forming a material layer comprising one of silicon dioxide and silicon nitride above said substrate, said L-shaped spacer, and said gate electrode.

10. The method of claim 8, wherein said gate electrode structure comprises a high-k insulation layer and a metal layer positioned above said high-k insulation layer.

11. The method of claim 8, wherein said horizontal leg portion of said L-shaped spacer separates said second non-L-shaped spacer from said semiconducting substrate.

12. The method of claim 8, wherein forming said L-shaped spacer and said second non-L-shaped spacer comprises:
    forming a layer of silicon nitride comprising a first horizontal portion formed above said semiconducting substrate and a first vertical portion formed on and in direct physical contact with said vertical leg of said first non-L-shaped spacer;

forming a layer of silicon dioxide comprising a second horizontal and vertical portions that are formed on and in direct physical contact with said first horizontal and vertical portions, respectively, of said layer of silicon nitride;

performing a first etching process to remove said second horizontal portion from above said first horizontal portion so as to define said second non-L-shaped spacer having said exposed outer surface, said second non-L-shaped spacer covering a first part of said first horizontal portion and exposing a second part of said first horizontal portion that is positioned beyond said exposed outer surface at said base of said vertical leg of said second non-L-shaped spacer; and performing a second etching process to remove said exposed second part of said layer of silicon nitride while using said second non-L-shaped spacer as a mask so as to define said L-shaped spacer, wherein an outside edge of said horizontal leg portion of said L-shaped spacer is aligned with said exposed outer surface at said base of said vertical leg of said second non-L-shaped spacer.

13. A method, comprising:

forming a gate electrode structure above a semiconducting substrate;

forming a first non-L-shaped spacer adjacent to a sidewall of said gate electrode structure by depositing a first layer of silicon nitride above said gate electrode structure and said semiconducting substrate and performing a first etching process on said first layer of silicon nitride, wherein said first non-L-shaped spacer has a vertical leg aligned with said sidewall but does not have a horizontal leg extending laterally away from said sidewall;

after forming said first non-L-shaped spacer, forming a second layer of silicon nitride comprising vertical portions that are formed on and in direct physical contact with said vertical leg of said first non-L-shaped spacer and horizontal portions that are formed on and in direct physical contact with said semiconducting substrate;

after forming said second layer of silicon nitride, forming a layer of silicon dioxide comprising vertical portions that are formed on and in direct physical contact with said vertical portions of said second layer of silicon nitride and horizontal portions that are formed above said horizontal portions of said second layer of silicon nitride;

performing a second etching process to remove said horizontal portions of said layer of silicon dioxide so as to define a second non-L-shaped spacer that has a vertical leg aligned with said sidewall but does not have a horizontal leg extending laterally away from said sidewall, said second non-L-shaped spacer covering a first part of said horizontal portions of said second layer of silicon nitride and exposing a second part of said horizontal portions of said second layer of silicon nitride; and after forming said second non-L-shaped spacer, performing a third etching process to remove said exposed second part of said horizontal portions of said second layer of silicon nitride while using said second non-L-shaped spacer as a mask so as to define an L-shaped spacer having a vertical leg portion that is positioned between and in direct physical contact with said vertical legs of said first and second non-L-shaped spacers and a horizontal leg portion that is positioned on and in direct physical contact with said semiconducting substrate.

14. The method of claim 13, wherein said horizontal leg portion of said L-shaped spacer is positioned between said second non-L-shaped spacer and said semiconducting substrate.

15. The method of claim 13, wherein said vertical leg of said non-L-shaped spacer is formed on and in direct physical contact with said sidewall of said gate electrode structure.

16. The method of claim 13, wherein said second non-L-shaped spacer is formed on and in direct physical contact with said horizontal leg portion of said L-shaped spacer.

17. The method of claim 13, wherein said gate electrode structure comprises a high-k insulation layer and a metal layer positioned above said high-k insulation layer.

18. The method of claim 13, wherein a combined thickness of said vertical leg portion of said L-shaped spacer and said vertical leg of said second non-L-shaped spacer defines a total lateral width of said L-shaped spacer.

* * * * *